United States Patent [19]

Barrera et al.

[11] Patent Number: 4,939,071
[45] Date of Patent: Jul. 3, 1990

[54] METHOD FOR FORMING LOW RESISTANCE, SUB-MICROMETER SEMICONDUCTOR GATE STRUCTURES

[75] Inventors: Joseph S. Barrera, Los Altos; Charles T. Strouth, Cupertino, both of Calif.

[73] Assignee: Harris Corporation, Melbourne, Fla.

[21] Appl. No.: 586,703

[22] Filed: Mar. 6, 1984

[51] Int. Cl.⁵ .............................................. G03C 5/00
[52] U.S. Cl. ................................... 430/314; 430/315; 430/316; 430/317; 430/318; 430/324; 430/329; 437/180; 437/203; 437/229
[58] Field of Search ................ 427/88, 89; 430/317, 430/314, 315, 318, 319, 329, 316, 312, 323, 324; 437/229, 80, 203

[56] References Cited

U.S. PATENT DOCUMENTS

| | | |
|---|---|---|
| 3,761,264 | 9/1973 | Sterzer. |
| 3,873,361 | 3/1975 | Franc et al. .................. 427/88 X |
| 4,088,490 | 5/1978 | Duke et al. .................. 427/89 X |
| 4,213,840 | 7/1980 | Omori et al. . |
| 4,525,448 | 6/1985 | Ghosh ....................... 430/324 X |
| 4,546,066 | 10/1985 | Field et al. ................... 430/314 |
| 4,621,415 | 11/1986 | Tran ........................ 437/203 X |

FOREIGN PATENT DOCUMENTS 55-41728  3/1980  Japan .

Primary Examiner—Jose Dees
Attorney, Agent, or Firm—Barnes & Thornburg

[57] ABSTRACT

A process for forming a T or Y gate structures on the surface of semiconductor device substrates is disclosed wherein the gate length is extremely small, and low resistance along the gate width using light field photolithographic processing techniques, and a positive photo-resist, which allows definition of areas of smaller dimension than conventional dark field photolithographic techniques.

9 Claims, 2 Drawing Sheets

METHOD FOR FORMING LOW RESISTANCE, SUB-MICROMETER SEMICONDUCTOR GATE STRUCTURES

BACKGROUND AND SUMMARY OF THE INVENTION

This invention pertains to the formation of gate structures for semiconductor devices, and particularly for microwave semiconductor devices. More particularly, this invention relates to the formation of gates of extremely small length.

The fabrication of metal gate electrode semiconductor FETs has received increased attention in the semiconductor industry in recent years, especially in that segment regarding high frequency microwave operation. Of particular interest has been the formation of gate electrodes of particularly small length in the submicrometer range with low electrical resistance along the width of the gate. One particular method for forming such FET gates is described in U.S. Pat. 4,213,840, which is incorporated herein by reference.

In processes of this type, it is conventional to form a gate electrode that has, in vertical transverse cross-section perpendicular to the width of the electrode, a T or Y configuration. The narrow portion or stem of the electrode is that actually in contact with the substrate or semiconductor body, and overlying that stem is a broader portion of deposited metal, the broader portion being particularly useful in reducing resistance along the width of the gate electrode, as well as providing for ease of bonding thereto.

The particularly critical step in the formation of such electrodes is the photolithographic techniques practiced in establishing the photo-resist mask which will define the stem or substrate connection of the gate electrode. Conventionally, as in U.S. Pat. No. 4,213,840, this photolithographic definition is accomplished through the use of a positive image "dark field" mask. In this process, a photo-resist layer is first coated on the surface of the substrate which will bear the gate electrode. Thereafter, a mask is applied, with an opening or transparent portion which will define the area wherein the gate is to be formed, and the photo-resist is irradiated through the mask. That portion of the photo-resist underlying the opening in the mask which will define the gate electrode stem is affected by the radiation, frequently causing cross-linking of the photo-resist material, altering its solubility. The remainder of the photo-resist, shielded by the mask, is not so altered. After irradiation, the photo-resist is treated with a solvent, to either remove the irradiated and cross-linked material, or the non-irradiated material, depending on the operator's choice of processing techniques.

One phenomenon common to this type positive image or dark field mask photolithographic technique is the formation of an image substantially larger in cross-sectional dimension than the opening in the mask itself. This phenomenon is illustrated in FIG. 1. Photo-resist layer 102 lies deposited on the surface of substrate 100, on which is to be formed the gate electrode. Overlaying photo-resist 102 is mask 104, with opening 106, defining the theoretical gate formation area 108 of length X. However, as the surface of mask 104 and the photo-resist underlying opening 106 is irradiated, incident irradiation, combined with lateral cross-linking on light overexposure, causes a portion 110 of the photo-resist to be irradiated. As a result, when the mask is removed and the selected portion of the photo-resist 102 is developed, actual gate formation area 112 is left, which is substantially larger, in surface area, than theoretical and desired formation area 108. Thus, particularly when gate length at or substantially below 1 micrometer are desired to be created, it is particularly difficult to use positive image or dark field masking techniques, as the length of the gate stem formed is always substantially larger than the mask opening, and larger than desired. For example, a 0.8 micrometer mask opening might result in a 0.9 to 1.0 micrometer photo-resist opening.

Accordingly, it is an object of this invention to provide a process whereby gate electrodes of small length and low resistance along the gate width may be formed.

Another object of this invention is to provide a process whereby gate electrodes of gate stem length substantially below 1 micrometer can be formed.

Yet another object of this invention is to provide a process whereby gate electrodes whose stem length is always less than the length of the mask used to define that stem length may be formed.

These and other objects of this invention are attained by employing a negative image "light field" mask to define the area in which the gate electrode stem is to be formed on the surface of the semiconductor substrate support. A photo-resist is applied over the surface of the substrate on which the gate electrode is to be formed. Thereafter, a mask which is opaque to irradiation, over the area in which the gate electrode stem is to be formed is applied over the photo-resist, and the photo-resist subsequently irradiated. A portion of the photo-resist, which will always be smaller in dimension than the opaque portion of the mask will not be irradiated, while all other portions (the light field) will be irradiated, and their solubilities thus being altered. Thereafter, the irradiated photo-resist is removed by a development wash, leaving behind only the thin photo-resist line defining the stem of the gate electrode. A dielectric layer is deposited over the surface of the substrate and photo-resist line, and thereafter the photo-resist line is removed, along with the overlying dielectric forming an opening in the dielectric layer to the substrate surface smaller in dimension than the photo-resist mask. A layer of metal is deposited to form the stem of the gate electrode in the opening. Thereafter, a mask is set down to define a cap area overlapping the stem on either side, and the metal layer is removed, except in the defined area. Therafter, the remaining processing of the substrate is conducted including the removal of the mask.

Alternatively, the dielectric layer may be formed before the photo-resist is applied and a similar process is used to produce a metal mask to form the opening in the dielectric layer. Also, a second gate metal layer may be formed and used as a mask in forming the defined cap area.

DETAILED DESCRIPTION OF THE DRAWINGS

Figure 1:
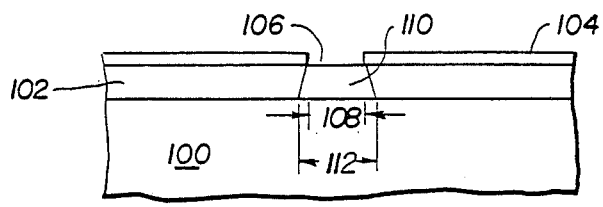
FIG. 1 is a representational cross-sectional illustration of conventional dark field masking photolithic techniques.
Figure 2:
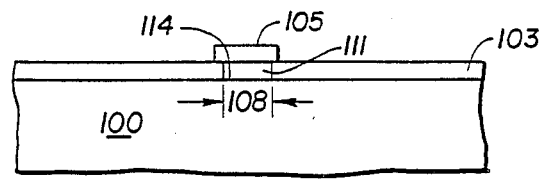
FIG. 2 is a representational cross-sectional view illustrating the light field photolithograph processing techniques of this invention.

This invention begins with a semiconductor device substrate 100 of conventional composition which either has semiconductor elements previously formed in and on the substrate, or has the elements formed after the formation of the gate electrode made by this process. A layer of positive photo-resist 103 is deposited on the surface of the substrate which is to bear the gate electrode, and thereafter a light field mask 105 is provided thereover. As noted above, and illustrated in FIG. 2, mask 105 corresponds, in dimension, to theoretical area 108 on the surface of the substrate which is intended to be the portion of the substrate contacted by the stem of the gate electrode. However, upon irradiation, a section 111 of photo-resist 103 smaller in dimension than mask 105 is shielded, defining substrate surface portion 114 which will be the area whereon is formed the stem of the gate electrode. Non-irradiated portion 111 and corresponding substrate surface portion 114 will maintain the shape of opaque mask 105, preferably rectangular, even on moderate overexposure. After irradiation, photo-resist layer 103 is developed away, except the thin line of area 111.

Figure 3:
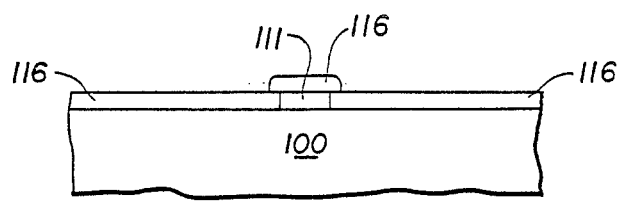
FIGS. 3–7 are cross-sectional representational views of a semicoductor device being formed at various stages during the process of this invention.
Figure 4:
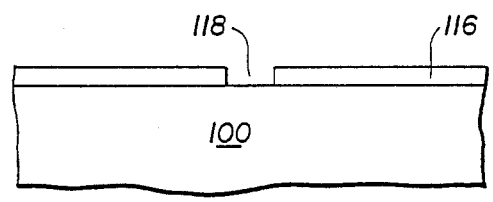

Thereafter, as illustrated in FIG. 3, dielectric layer 116 is deposited over the field of substrate 100 as well as over a thin line 111 of photo-resist material 103. Photo-resist material 111 and the portion of dielectric layer 116 overlaying the remaining photo-resist material is removed, thereby providing opening 118 to substrate 100 through dielectric layer 116 illustrated in FIG. 4. It is to be noted that resulting opening 118 is smaller than the original dimensions of mask 105, and smaller than the opening that would be provided using a dark field mask having an opening corresponding to the opaque portion of light field mask 105.

After the substrate surface in space 118 is exposed, the substrate surface may be etched, if desired, prior to the formation of the stem, as is conventional in the art.

Thereafter, substrate 100 and dielectric layer 116 thereover, are provided with metal layer 120. Although any of a wide variety of metal compositions will be known to those of skill in the art which are suitable for the formation of the stem of the gate electrode, a preferred composition is comprised of sequentially applied titanium, platinum and gold layers. It will be observed that, in contrast to the prior art, by provision of dielectric insulating layer 116, the deposition of metal layer 120 need not necessarily be at minimum or low power evaporation levels, as there is no photo-resist layer to be deformed, and the substrate is otherwise insulated. In contrast thereto, in conventional systems wherein a dark field mask and positive photo-resist layer is employed, photo-resist surrounds the opening defining the base of the gate electrode, and is easily deformed by the energy applied for metallization.

Figure 5:
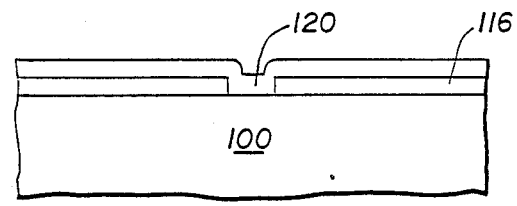

The resulting device is illustrated in FIG. 5.

Figure 6:
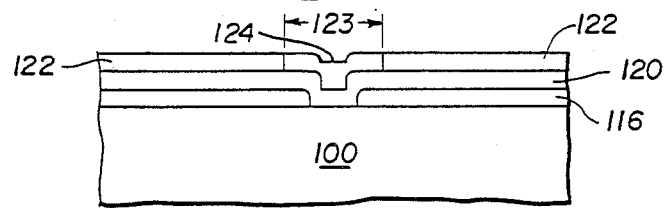

In order to form the upper portion, or cap, of the gate electrode, a second photo-resist layer 122 is deposited on metal layer 120. A mask is used to define region 123, similar in shape to opening 118, but slightly larger, so that an overhang is established, symmetrically, on each side. Although this second area may be defined using either positive or negative photo-resists and dark or light masks, it has been particularly illustrated in FIG. 6 as using a positive photo-resist and a dark field mask. As such, photo-resists are more widely available in the art, and the achievement of minumum dimensions is not critical for the cap of the gate electrode, area 123 may be defined using a dark field mask. Thereafter, the opening 123 in photo-resist layer 122 is provided with a layer of gold or similar metal to produce gate electrode cap 124 directly overlaying the gate electrode base provided by layer 120 in space 118. The gate electrode cap 124 may be formed, preferably, by electroplating the exposed region of metal layer 120 underlying photo-resist layer 122. Alternatively, gold evaporation and "lifting" away of the excess by photo-resist removal may be used as is conventional.

Figure 7:
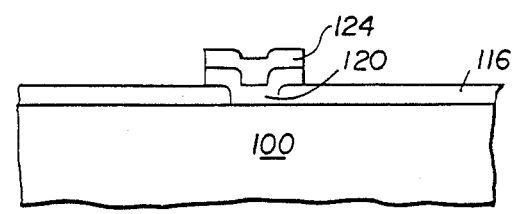

After formation of the gate electrode cap, the excess photo-resist 122 and the underlying metal 120 are removed, for instance by ion milling and/or successive solvent wash and etching steps. All of metal layer 120 is removed except that filling space 118 and underlying cap 124. The resulting device, a semiconductor substrate bearing a gate electrode of extremely small length (the width of opening 118) is illustrated in FIG. 7. Thereafter, conventional processing of the semiconductor substrate 100 may be practiced. If a single metal layer gate structure is to be formed, any masking and removal technique may be used to remove the excess portion of metal layer 116 to define the cap of the gate extending beyond the stem.

Figure 8:
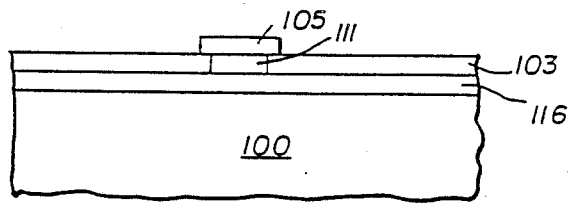
FIG. 8–10 are cross-sectional representational views of a semiconductor device at various stages during a modification of the process of FIGS. 3–7.
Figure 9:
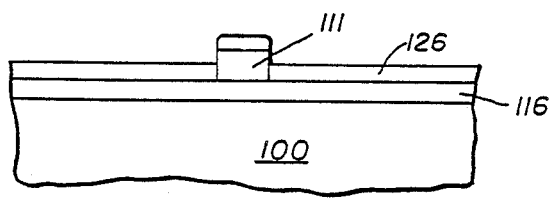
Figure 10:
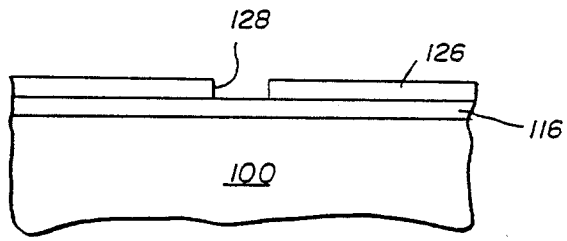

In an alternative embodiment, dielectric layer 116 may be deposited across the surface of substrate 100 prior to the deposition of positive photo-resist 103. Thereafter, photo-resist 103 is deposited over the dielectric layer, and the light field mask photolithographic processing techniques described above are employed, to leave a thin line 112 of photo-resist 103 (defining the base or stem of the gate electrode) on top of dielectric layer 116 as illustrated in FIG. 8. A thin layer of metal 126 is deposited, and thereafter, the thin line 112 of photo-resist layer 103 and corresponding portion of the metal layer 126 is lifted, and plasma etching conducted to duplicate the resulting opening in the thin metal layer in the dielectric layer 116. Thereafter, metallization and removal of excess layers, as described above, is practiced. The use of alternative embodiments will be dictated by the processing conveniences and advantages provided thereby. For example, the thin metal mask layer 126 may remain or be removed before applying the first gate metal layer 126.

Through the process disclosed above, a gate electrode of extremely small gate length, but with low resistance along its width due to the overlaying metal cap, is provided. In addition to the fact that the gate stem will always be smaller in length than the mask used, in contrast to the gates produced by corresponding masks of conventional processes, it should be observed that light field masks of considerably finer dimension than dark field masks are currently available in the art, due to the fact that the light field masks requires only the formation of a line, whereas the dark field mask requires the formation of the precise opening therein. Accordingly, in addition to the advantages enjoyed by the instant process over conventional processes for any equivalent mask design, light field masks employed in the instant invention can be designed to provide gate electrodes of length substantially smaller than currently available dark field masks. For example, a 0.25 micrometer contact masking process is more readily achieved with the instant invention than conventional processes.

Although the process of this invention has been described with reference to particular embodiments, it will be apparent to those of ordinary skill in the art that many variations, particularly with respect to metal composition and photo-resist qualities, as well as shape will occur to those of ordinary skill in the art without the exercise of inventive faculty. This invention should not be so limited, nor is it intended to be limited to the applicant's theoretical explanation of the behavior of light and dark field masks and photolithographic techniques. Nor is it limited to formation of submicrometer lines on semiconductors. The instant invention may be applied to excellent advantage to the fields of acoustic wave structures, optical grating formation, Josephson junctions, bubble memories, permeable base transistors and a host of other technologies where submicrometer patterns are required.

What is claimed is:

1. A method of providing on a support of a substrate a covering layer having at least one sub-micron-size recess therein, comprising the steps of:
    covering at least a section of the support surface that includes the desired location of the recess with a photoresist layer;
    masking an area of the photoresist layer that covers said location, such masked area having a size exceeding the desired size of the recess;
    subjecting the photoresist layer to overexposure with an attendant reduction in the size of said masked area down to said desired size of the recess;
    removing the photoresist layer from a region of the support surface surrounding the reduced-size area;
    applying the covering layer at least to said region; and
    clearing said reduced-size area to provide the recess.

2. A method of fabricating a sub-micron-size gate on a support surface of a semiconductor substrate, comprising the steps of:
    covering at least a section of the support surface that includes the desired location of the gate with a photoresist layer;
    masking an area of the photoresist layer that covers said location, such masked area having a size exceeding the desired size of the gate;
    subjecting the photoresist layer to overexposure with an attendant reduction in the size of said masked area down to said desired size of the gate;
    removing the photoresist layer from a region of the support surface surrounding the reduced-size area;
    providing a protective coating at least on said region;
    clearing said reduced-size area to provide a recess in said protective coating; and
    depositing gate material at least in said recess.

3. The method as defined in claim 2, wherein said providing step includes depositing a layer of a silicon compound selected from the group consisting of silicon dioxide and silicon nitride.

4. The method as defined in claim 2, wherein said clearing step includes a lift-off of the photoresist material to provide said recess.

5. A process for formation of gate structures of extremely small length on a surface of a semiconductor substrate, comprising:
    forming a first layer of positive photo-resist material on the surface of said substrate;
    providing a light field mask defining the portion of said substrate surface to be contacted by said gate structure on said photo-resist and thereafter irradiating the portions of said first layer of photo-resist not shielded from irradiation by said mask;
    removing said irradiated portions of said first layer of photo-resist;
    forming a dielectric layer on the surface of said substrate and remaining photo-resist material portion;
    removing said remaining photo-resist material and the portion of said dielectric layer overlaying said remaining photo-resist portion, thereby exposing the portion of said substrate surface of less than one micron to be contacted by said gate structure;
    forming a first metal layer over said dielectric layer and in contact with said exposed portion of said substrate surface;
    forming a second photo-resist layer over said first metal layer and photolithographically defining an area in said second photo-resist layer overlaying an overhanging said portion of said first metal layer in contact with said substrate;
    removing said defined area thereby forming an opening in said second photo-resist layer;
    forming a second metal layer in said opening; and
    removing all of said second photo-resist layer and all of said first metal layer except that portion directly underlying said second metal layer.

6. A process for formation of gate structures of extremely small length on a surface of a semiconductor substrate, comprising:
    forming a layer of dielectric matrerial on the surface of said substrate;
    forming a first layer of positive photo-resist material on said dielectric layer;
    providing a light field mask defining the portion of said substrate surface to be contacted by said gate structure on said first photo-resist layer and thereafter irradiating the portions of said first photo-resist layer not shielded from irradiation by said mask;
    removing said irradiated portions of said first photo-resist layer;
    forming a thin metal layer over said dielectric layer and the remaining portion of said first photo-resist layer;
    removing said remaining portion of said first photo-resist layer and the portion of said thin metal layer overlaying said remaining portion of said first photo-resist layer thereby creating an opening in said thin metal layer to said dielectric layer over the portion of said substrate surface to be contacted by said gate structure;
    removing the portion of said dielectric layer directly underneath said opening in said thin metal layer, thereby exposing the portion of said substrate surface of less than one micron to be contacted by said gate structure;
    forming a second metal layer over said thin metal layer and in contact with said exposed portion of said substrate surface;
    forming a second photo-resist layer over said second metal layer and photolithographically defining an opening in said second photo-resist layer overlaying and overhanging said portion of said second metal layer in contact with said substrate;
    removing said defined area, thereby forming an opening in said second photo-resist layer;

forming a third metal layer in said opening; and
removing all of said second photo-resist layer, thin metal layer and all of said second metal layer except that portion underlying said third metal layer.

7. A process for formation of gate structures of extremely small length on a surface of a semiconductor substrate, comprising:
   forming a first layer of positive photo-resist material on the surface of said substrate;
   providing a first light field mask defining the portion of said substrate surface to be contacted by said gate structure on said photo-resist and thereafter irradiating the portions of said first layer of photo-resist not shielded from irradiation by said mask;
   removing said irradiated portions of said first layer of photo-resist;
   forming a dielectric layer on the surface of said substrate and remaining photo-resist material portion;
   removing said remaining photo-resist material and the portion of said dielectric layer overlaying said remaining photo-resist portion, thereby exposing the portion of said substrate surface of less than one micron to be contacted by said gate structure;
   forming a metal layer over said dielectric layer and in contact with said exposed porton of said substrate surface;
   forming a second mask over said metal layer defining an area on said metal layer overlaying and overhanging said portion of said first metal layer in contact with said substrate;
   removing said metal layer except in said defined area; and
   removing said second mask.

8. A process for formation of gate structures of extremely small length on a surface of a semiconductor substrate, comprising:
   forming a layer of dielectric material on the surface of said substrate;
   forming a first layer of positive photo-resist material on said dielectric layer;
   providing a light field mask defining the portion of said substrate surface to be contacted by said gate structure on said first photo-resist layer and thereafter irradiating the portions of said first photo-resist layer not shielded from irradiation by said mask;
   removing said irradiated portions of said first photo-resist layer;
   forming a thin metal layer over said dielectric layer and the remaining portion of said first photo-resist layer;
   removing said remaining portion of said first photo-resist layer and the portion of said thin metal layer overlaying said remaining portion of said first photo-resist layer thereby creating an opening in said thin metal layer to said dielectric layer over the portion of said substrate surface to be contacted by said gate structure;
   removing the portion of said dielectric layer directly underneath said opening in said thin metal layer, thereby exposing the portion of said substrate surface of less than one micron to be contacted by said gate structure;
   forming a second metal layer over said thin metal layer and in contact with said exposed portion of said substrate surface;
   forming a second mask over said second metal layer defining an area on said second metal layer overlaying and overhanging said portion of said second metal layer in contact with said substrate;
   removing said thin and second metal layer except in said defined area; and
   removing said second mask.

9. A process for formation of gate structures of extremely small length on a surface of a semiconductor substrate, comprising:
   forming a layer of dielectric material on the surface of said substrate;
   forming a first layer of positive photo-resist material on said dielectric layer;
   providing a light field mask defining the portion of said substrate surface to be contacted by said gate structure on said first photo-resist layer and thereafter irradiating the portions of said first photo-resist layer not shielded from irradiation by said mask;
   removing said irradiated portions of said first photo-resist layer;
   forming a thin metal layer over said dielectric layer and the remaining portion of said first photo-resist layer;
   removing said remaining portion of said first photo-resist layer and the portion of said thin metal layer overlaying said remaining portion of said first photo-resist layer thereby creating an opening in said thin metal layer to said dielectric layer over a portion of said substrate surface to be contacted by said gate structure;
   removing the portion of said dielectric layer directly underneath said opening in said thin metal layer, thereby exposing the portion of said substrate surface of less than one micron to be contacted by said gate structure;
   removing said thin metal layer;
   forming a second metal layer over said dielectric layer and in contact with said exposed portion of said substrate surface;
   forming a second mask over said second metal layer defining an area on said second metal layer overlaying and overhanging said portion of said second metal layer in contact with said substrate;
   removing said second metal layer except in said defined area; and
   removing said mask.

* * * * *